United States Patent
Lin et al.

(10) Patent No.: US 7,426,956 B2
(45) Date of Patent: *Sep. 23, 2008

(54) HEAT DISSIPATING APPARATUS

(75) Inventors: Tong-Hua Lin, Guangdong (CN);
Chin-Lung Chen, Guangdong (CN);
Yeu-Lih Lin, Guangdong (CN);
Da-Chang Chou, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 241 days.

This patent is subject to a terminal disclaimer.

(21) Appl. No.: 11/164,893

(22) Filed: Dec. 9, 2005

(65) Prior Publication Data

US 2006/0266500 A1    Nov. 30, 2006

(30) Foreign Application Priority Data

May 29, 2005    (CN)    ................ 2005 1 0034983

(51) Int. Cl.
*H05K 7/20*    (2006.01)

(52) U.S. Cl. ................ 165/104.33; 165/80.3; 165/182; 361/700

(58) Field of Classification Search ............ 165/104.33, 165/151, 182
See application file for complete search history.

(56) References Cited

U.S. PATENT DOCUMENTS

| | | | | |
|---|---|---|---|---|
| 1,805,116 | A * | 5/1931 | Trane | 165/68 |
| 1,907,036 | A * | 5/1933 | Belleau | 165/164 |
| 2,948,515 | A * | 8/1960 | Mehalick et al. | 165/122 |
| 6,542,364 | B2 | 4/2003 | Lai et al. | |
| 6,625,021 | B1 | 9/2003 | Lofland et al. | |
| 6,725,909 | B1 * | 4/2004 | Luo | 165/104.21 |
| 6,766,851 | B1 * | 7/2004 | Lo | 165/185 |
| 6,785,140 | B2 * | 8/2004 | Artman et al. | 361/709 |
| 6,953,081 | B2 * | 10/2005 | Klingler et al. | 165/43 |
| 6,959,755 | B2 * | 11/2005 | Chen | 165/80.3 |
| 7,121,333 | B2 * | 10/2006 | Wang | 165/182 |
| 7,128,131 | B2 * | 10/2006 | Kubo | 165/80.3 |
| 7,298,621 | B2 * | 11/2007 | Xia et al. | 361/701 |

* cited by examiner

*Primary Examiner*—Allen J Flanigan
(74) *Attorney, Agent, or Firm*—Winston Hsu

(57) ABSTRACT

A heat dissipating apparatus (10) includes a base (20), a plurality of stacked fins (30), and at least a heat pipe (40). The base absorbs heat from a heat-generating component. Each of the fins includes a main body (32), and a plurality of projection members (33) extending from the main body. The projection members of a first fin connect the projection members of a second fin. The projection members form a first heat transfer path for transferring heat from the base to the fins. The heat pipe includes a heat-absorbing portion (42) thermally contacting with the base, and a heat-dissipating portion (44) contacting with the fins. The heat pipe forms a second heat transfer path for transferring the heat from the base toward the fins.

16 Claims, 6 Drawing Sheets

1

HEAT DISSIPATING APPARATUS

FIELD OF THE INVENTION

The present invention relates generally to a heat dissipating apparatus, and particularly to a heat dissipating apparatus for a heat generating electronic component.

DESCRIPTION OF THE RELATED ART

Developments in electronic technology have resulted in many heat problems needing to be resolved. A heat dissipating apparatus is often attached on a heat-generating electronic component to efficiently remove the heat generated by the component.

Conventionally, the heat dissipating apparatus includes a base, a plurality of fins, a plurality of heat pipes, and an air providing fan. The base contacts with the heat-generating component for absorbing heat from the heat-generating component. Each of the fins spaces a predetermined distance with each other, thereby forming a plurality of air passages therebetween. Each of the heat pipes includes a heat-absorbing portion thermally connecting with the base, and a heat-dissipating portion extending through the fins. The heat-absorbing portions of the heat pipes absorb heat from the base and transfer it to the heat-dissipating portions of the heat pipes. The fins absorb the heat from the heat-dissipating portions of the heat pipes and exchange the heat with an airflow flowing through the air passages, to accomplish the heat dissipating process.

In this heat dissipating apparatus, each of the fins is flat throughout. This makes the air passages formed between the fins each have a large width perpendicular to a flowing direction of the airflow. Air turbulences occur along a width direction of the air passages when the airflow flows therethrough. The airflow can not quickly and smoothly flow through the air passages. This will decrease the heat dissipating efficiency of the heat dissipating apparatus. A heat dissipating apparatus, which can prevent the occurrence of the turbulences and increases heat dissipating efficiency is needed.

SUMMARY OF INVENTION

The present invention relates to a heat dissipating apparatus. According to a preferred embodiment of the present invention, the heat dissipating apparatus includes a base, a plurality of stacked fins, and at least a heat pipe. The base absorbs heat from a heat-generating component. Each of the fins includes a main body, and a plurality of projection members extending from the main body. The projection members of a first fin connect with the projection members of a second fin, whereby a first heat transfer path for transferring heat from the base to the fins is formed by the projection members. The heat pipe includes a heat-absorbing portion thermally contacts with the base, and a heat-dissipating portion contacts with the fins, to transfer heat from the base toward the fins to form a second heat transfer path. The heat generated by the heat-generating component is transferred to the fins via the first and second heat transfer paths, thereby increasing the heat dissipating efficiency of the heat dissipating apparatus.

Other advantages and novel features of the present invention will become more apparent from the following detailed description of preferred embodiment when taken in conjunction with the accompanying drawings, in which:

DETAILED DESCRIPTION

Figure 1:
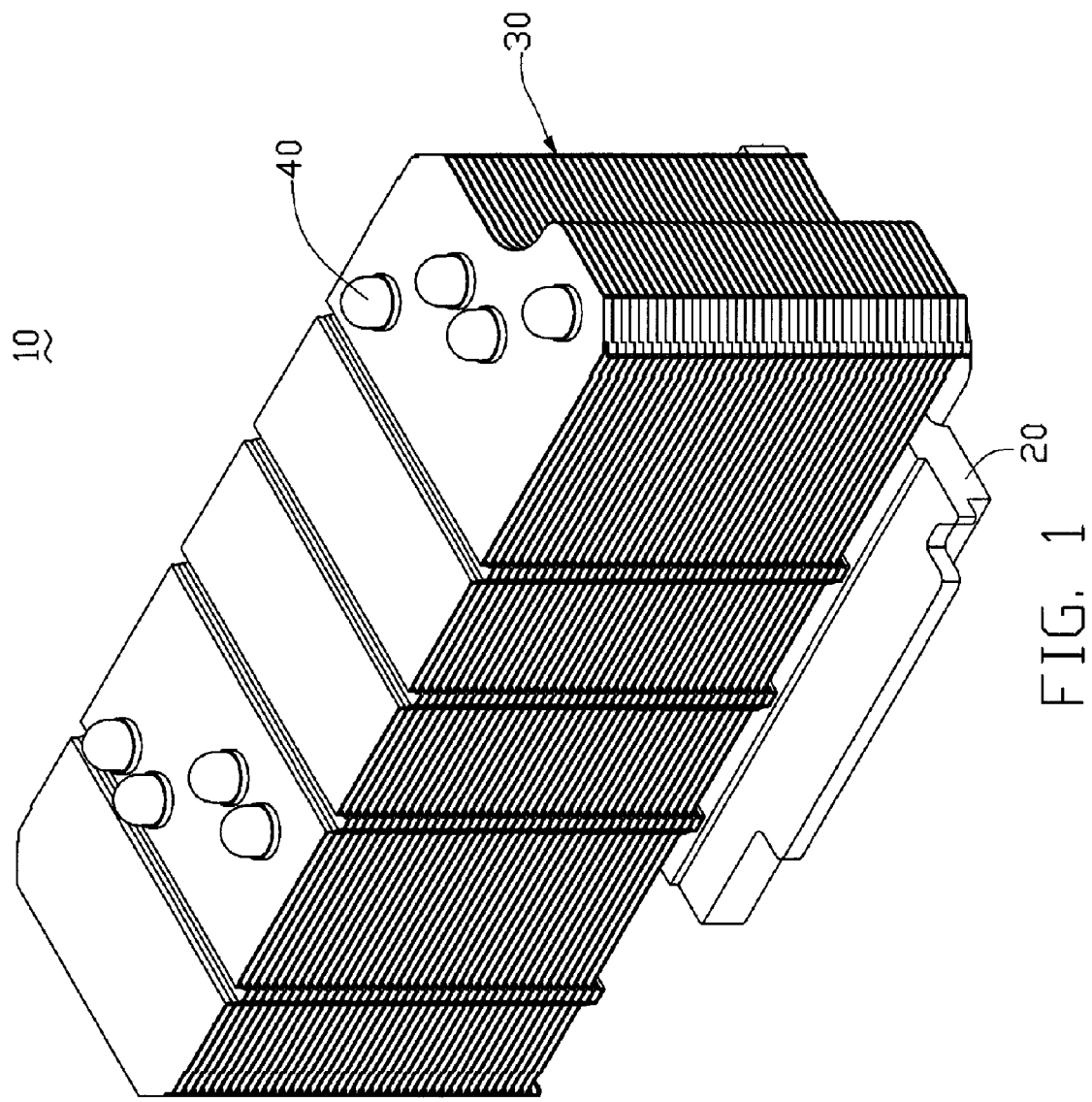
FIG. 1 is an assembled view of a heat dissipating apparatus according to a preferred embodiment of the present invention.
Figure 2:
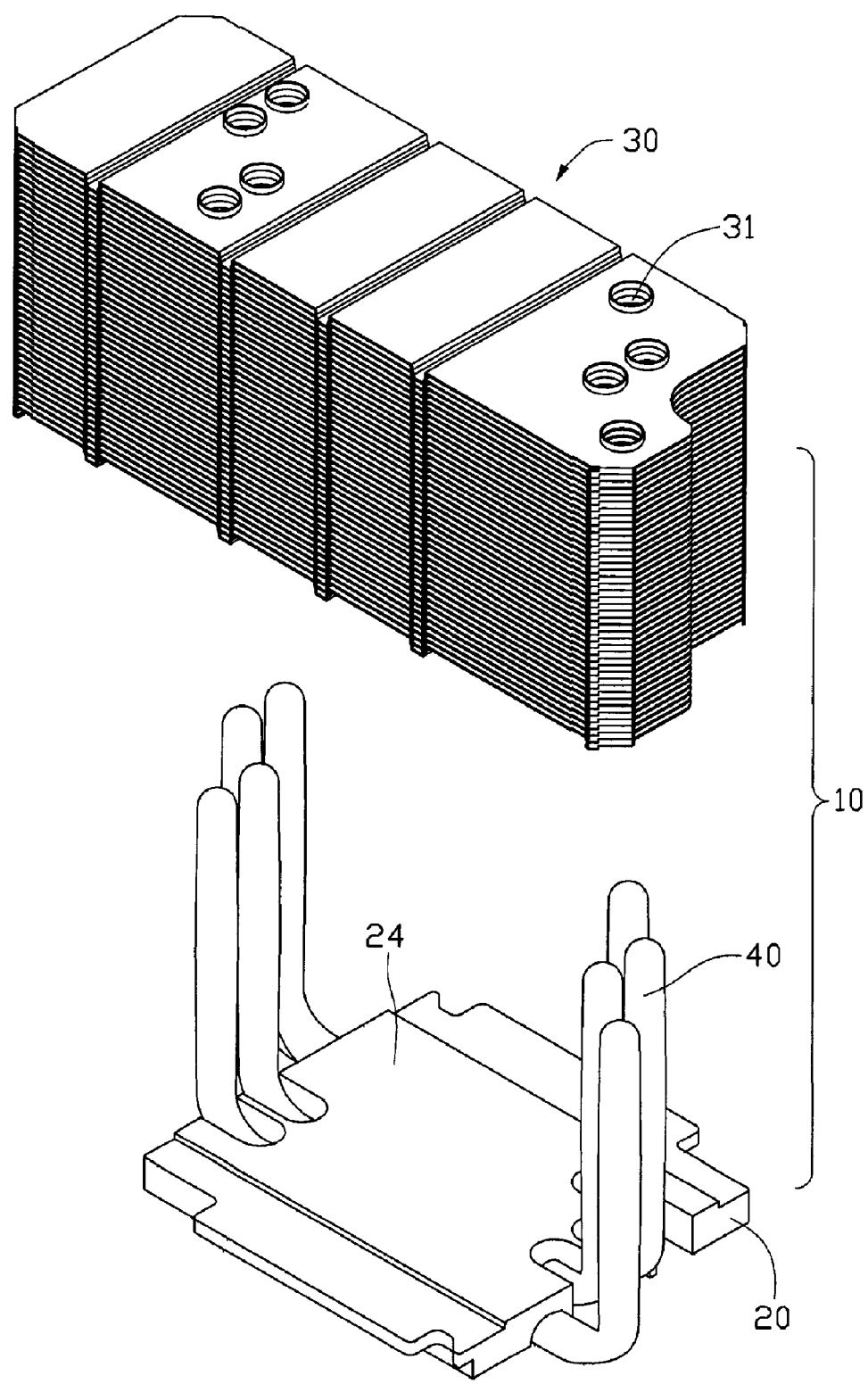
FIG. 2 is an exploded, isometric view of the heat dissipating apparatus shown in FIG. 1.
Figure 3:
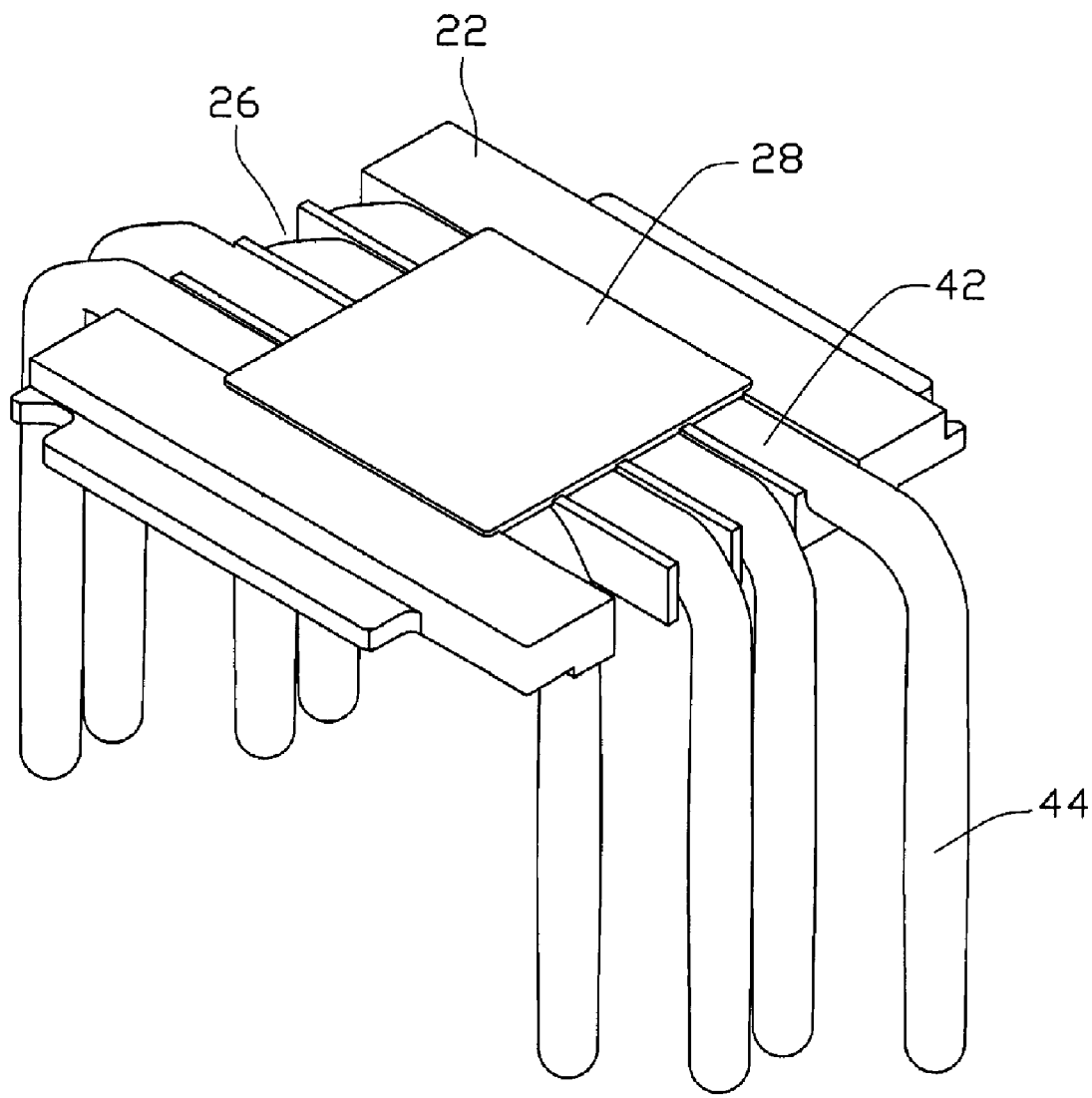
FIG. 3 is an isometric view of a base and a plurality of heat pipes of the heat dissipating apparatus shown in FIG. 1, but viewed from a bottom aspect.

Referring to FIGS. 1 to 3, a heat dissipating apparatus 10 according to a preferred embodiment of the present invention includes a base 20, a plurality of stacked fins 30, and a plurality of heat pipes 40.

The base 20 is made of material such as aluminum or copper which has good heat-conductivity capability. The base 20 includes a bottom surface 22, and a top surface 24 opposite to the bottom surface 22. The bottom surface 22 defines a plurality of receiving grooves 26 therein for receiving the heat pipes 40.

The heat pipe 40 is "U" shaped. Each of the heat pipes 40 includes a heat-absorbing portion 42, and two heat-dissipating portions 44 perpendicularly extending from two opposite ends of the heat-absorbing portion 42, respectively. The heat-absorbing portions 42 of the heat pipes 40 are bonded into the grooves 26 of the base 20 by soldering. The heat-dissipating portions 44 of the heat pipes 40 extend through a plurality of through holes 31 defined in the fins 30, respectively. Alternatively, the heat pipe 40 may be "L" shaped. In this situation, only one heat-dissipating portion extends upwardly from one end of the heat-absorbing portion of the heat pipe.

A heat absorbing plate 28 is attached to the bottom surface 22 of the base 20, thereby sandwiching the heat-absorbing portions 42 of the heat pipes 40 between the base 20 and the heat absorbing plate 28. A bottom surface of the heat absorbing plate 28 contacts with a top surface of a heat-generating component (not shown), for example, a CPU, to absorb heat generated by the heat-generating component. The heat absorbing plate 28 is made of material having heat conductivity better than or at least equal to the base 20, to enhance the heat absorbing capability thereof. In this embodiment, the heat absorbing plate 28 is made of copper. Alternatively, the heat absorbing plate 28 may be canceled, thereby making the bottom surface 22 of the base 20 and the heat-absorbing portion 42 of the heat pipes 40 directly contact with the heat-generating component.

Figure 4:
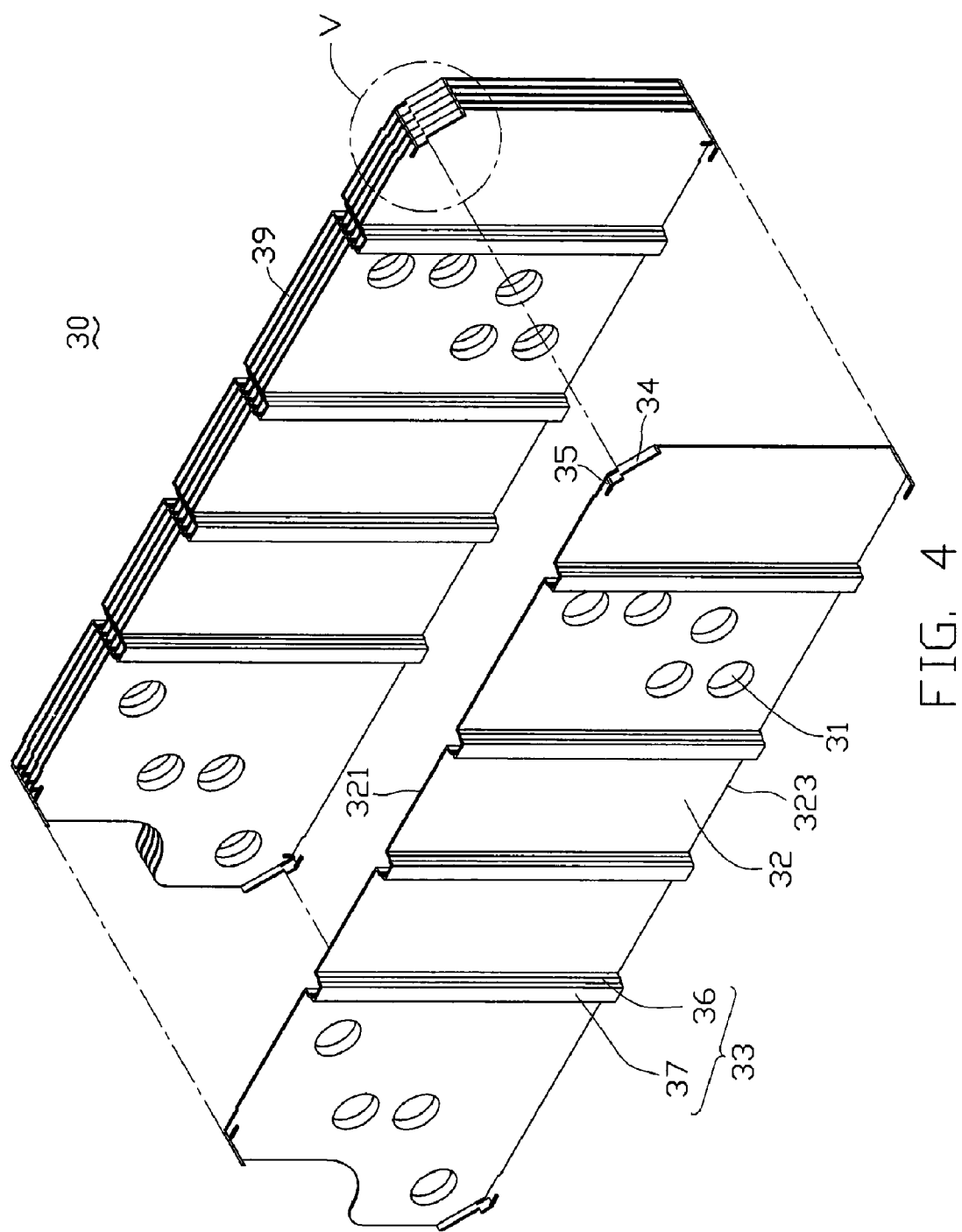
FIG. 4 is an isometric view of a fin assembly of the heat dissipating apparatus shown in FIG. 1.
Figure 5:
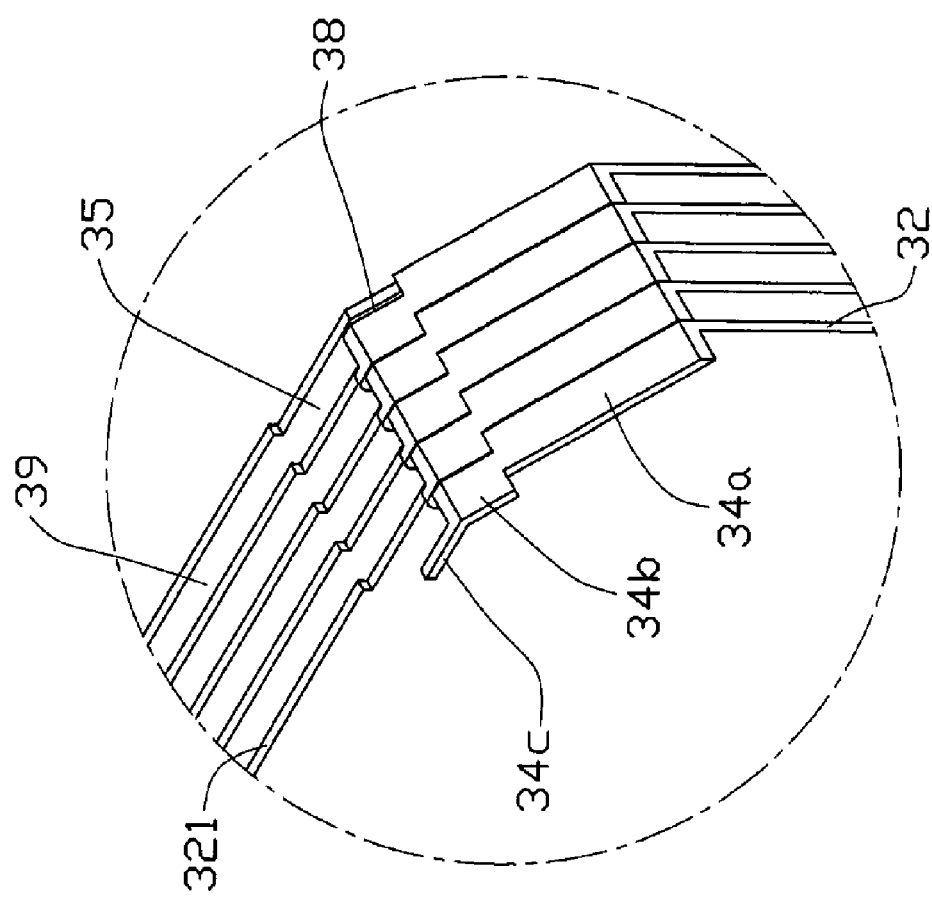
FIG. 5 is an enlarged view of a circled portion of FIG. 4 indicated by V.

The fins 30 are bonded on the base 20 by soldering, with a bottom surface of the fins 30 contacting with the top surface 24 of the base 20. Now referring to FIGS. 4 and 5, each of the fins 30 includes a rectangular main body 32. The main body 32 includes a plurality of projection members such as ribs 33 extending from one side of the main body 32, four locking members 34 extending from four corners of the main body 32, and four cutouts 35 corresponding to the locking members 34, respectively.

The ribs 33 extend from a top side 321 to a bottom side 323 of the main body 32. Each rib 33 is formed by pressing the main body 32 to form an indentation with a "U"-shaped cross section on the main body 32. Each of the ribs 33 includes two sidewalls 36 extending from the main body 32, and a base wall 37 integrally connecting with free ends of the sidewalls 36. Alternatively, the cross section of each of the ribs 33 may be triangle-shaped, or hemicycle-shaped.

Each of the locking members 34 includes an abutting plate 34a perpendicular to the main body 32, a flange 34b extending from one end of the abutting plate 34a, and a finger 34c extending from a free end of the flange 34b. A longitudinal extension direction of the abutting plate 34a forms a sharp angle with the top/bottom side 321/323 of the main body 32. The flange 34b extends along the longitudinal extension direction of the abutting plate 34a and offsets from the abutting plate 34a along a lateral direction of the abutting plate 34a. A slot 38 is defined between the flange 34b and the main body 32 of the fin 30. A part of the flange 34b extends beyond a free lateral edge of the abutting plate 34a. The cutout 35 is defined between the finger 34c of the locking member 34 and the main body 32.

In assembly of the fins 30, a first fin 30 is held in a vertical direction, and a second fin 30 is placed parallel to the first fin 30, with the ribs 33 of the second fin 30 abutting against the sidewalls 36 of the ribs 33 of the first fin 30. In such position, the free lateral edges of the abutting plates 34a of the first fin 30 abut against the main body 32 of the second fin 30, thereby defining an air passage 39 between the first fin 30 and the second fin 30. The flanges 34b of the first fin 30 are received in the slots 38 of the second fin 30, with a lateral edge of each flange 34b of the first fin 30 abutting against an opposite lateral edge of each flange 34b of the second fin 30. The fingers 34c of the first fin 30 extend in the cutouts 35 of the second fin 30, with each finger 34c of the first fin 30 being located adjacent to a front side of the main body 32 of the second fin 30, as viewed from FIG. 5. Then, other fins 30 are sequentially mounted to the second fin 30 in a similar fashion, for stacking the fins 30 in a group. Finally, the fingers 34c of each of the fins 30 are bent to a position that the fingers 34c of the fins 30 engage the main bodies 32 of corresponding neighboring fins 30. Thus, the fins 30 are connected together to form a fin assembly.

In assembly of the heat dissipating apparatus 10, the heat-absorbing portions 42 of heat pipes 40 are received in the grooves 26 of the base 20. The heat absorbing plate 28 is soldered to the bottom surface 22 of the base 20. Thus, the heat-absorbing portions 42 of heat pipes 40 are sandwiched between the base 20 and the heat absorbing plate 28, and the heat-dissipating portions 44 of the heat pipes 40 perpendicularly extend upwardly from the base 20. The fin assembly is oriented horizontally and bonded to the base 20 by soldering, making the heat-dissipating portions 44 of the heat pipes 40 extend through the through holes 31 of the fins 30, and the base walls 37 of the ribs 33 of a bottom fin 30 contact with the top surface 24 of the base 20. So the heat dissipating apparatus 10 is completely assembled. The base walls 37 of the ribs 33 of the bottom fin 30 is thermally connected to the base 20 by soldering. The heat-dissipating portions 44 of the heat pipes 40 are soldered in the through holes 31 to enhance heat conduction between the heat pipes 40 and the fins 30. The ribs 33 of the fins 30 can be connected together by soldering to enhance mechanical and thermal integrity of the fin assembly.

In the operation of the heat dissipating apparatus 10, the heat-absorbing plates 28 absorbs heat from the heat-generating component, and conducts it to the fins 30 through the base 20 and the ribs 33 of the fins 30 and the heat pipes 40, thereby forming a first and a second heat transfer path between the heat-generating component and the fins 30. The first heat transfer path is from the base 20 through the ribs 33 to the fins 30. The second heat transfer path is from the base 20 through the heat pipes 40 to the fins 30. Thus, the heat generated by the heat-generating component is speedily transferred to the fins 30, and the heat dissipating efficiency of the heat dissipating apparatus 10 is increased. Furthermore, the ribs 33 increase heat-exchanging areas between the fins 30 and airflows flowing through the air passages 39, thereby increasing the heat dissipation efficiency of the heat dissipating apparatus 10. The ribs 33 of each of the fins 30 abut against the sidewalls 36 of the ribs 33 of a neighboring fin 30. This strengthens the structure of the fin assembly, thereby preventing the fins 30 from vibrating and making noise when the airflow flows through the fin assembly. The interconnected ribs 33 divide the air passages 39 into five fluidically independent air channels (not labeled) through the fin assembly. These air channels are separated from each other. Thus, the airflow flowing through the fin assembly is divided into five independent sub-flows, thereby preventing turbulence from occurring in the air passages 39. So the airflow can quickly and smoothly flow through the fins 30 to effectively take heat thereaway. This can also increase heat dissipation efficiency of the heat dissipating apparatus 10.

Figure 6:
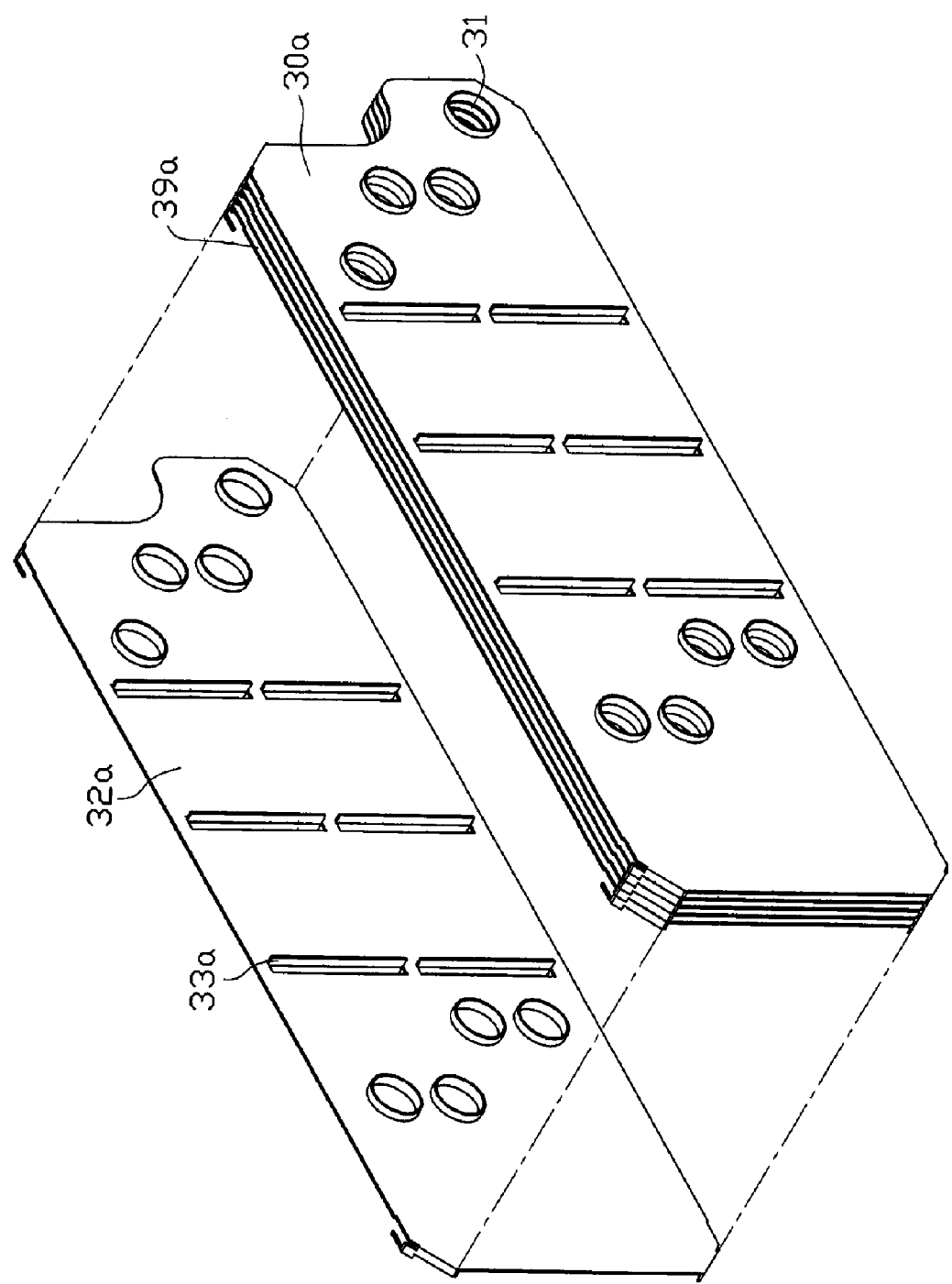
FIG. 6 is an isometric view of a fin assembly of a heat dissipating apparatus according to another embodiment of the present invention.

Referring to FIG. 6, a fin assembly of a heat dissipating apparatus according to a second embodiment of the present invention is shown. In this embodiment, the projection members like the ribs 33 of the first embodiment are formed by a plurality of air spacing plates 33a arrayed on the main body 32a of each fin 30a. The air spacing plate 33a is formed by stamping, wherein a hole (not labeled) adjacent to a corresponding spacing plate 33a is formed by the stamping. The air spacing plate 33a is perpendicularly projected toward one side of the main body 32a of the fin 30a. The air spacing plates 33a of a second fin 30a engage with the air spacing plates 33a of a first fin 30a, to divide each of the air passages 39a into a plurality of small air channels (not labeled), thereby making the airflow quickly and smoothly flow through the fins 30a to increase the heat dissipation efficiency of the heat dissipating apparatus. The air spacing plates 33a can be connected together by soldering thereby increasing the thermal and mechanical integrity of the fin assembly. In this embodiment, a flat side of the main body 32a of a bottom fin 30a, which is opposite to the side of the main body 32a from which the air spacing plates 33a project, contacts with the top surface 24 of the base 20 to absorb heat from the base 20. The heat is then transferred from the base 20 to the fins 30 via the air spacing plates 33a of the fins 30a, in addition to the heat pipes 40. Thus, the heat dissipation efficiency can also be increased by the heat dissipating apparatus according to this embodiment of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus comprising:
a base configured for absorbing heat from a heat generating component;
a plurality of fins stacked together along a predetermined direction, each of the fins comprising a main body, and a plurality of projection members extending from the main body, the projection members of a first fin connecting with the projection members of a second fin, the projection members together forming a first heat transfer path for transferring the heat from the base to the fins; and at least a heat pipe thermally connecting the base with the fins to form a second heat transfer path for transferring the heat from the base to the fins, the heat generated by the heat generating component being transferred to the fins via the first and second heat transfer paths, thereby increasing the heat dissipating efficiency of the heat dissipating apparatus;

wherein the first fin is coupled with the second fin via a plurality of locking members; and wherein the locking member comprises an abutting plate extending from the main body, a flange extending from one end of the abutting plate, and a finger offsets from a free edge of the flange, the main body defines a plurality of cutouts between the fingers and the main body, the fingers of the first fin extend through the cutouts of the main body of the second fin, and engage the main body of the second fin.

2. The heat dissipating apparatus as described in claim 1, wherein the projection members of one of the fins directly contact with a top surface of the base.

3. The heat dissipating apparatus as described in claim 1, wherein the projection members are a plurality of air spacing plates extending toward one side of the main body.

4. The heat dissipating apparatus as described in claim 1, wherein the projection members are a plurality of ribs extending from one side of the main body.

5. The heat dissipating apparatus as described in claim 4, wherein the cross section of each of the ribs is one of "U"-shaped, triangle-shaped and hemicycle-shaped.

6. The heat dissipating apparatus as described in claim 1, wherein the base defines at least a groove therein, the heat pipe includes a heat-absorbing portion received in the groove of the base, and at least a heat-dissipating portion extending through the fins.

7. The heat dissipating apparatus as described in claim 1, wherein the heat pipe is one of "U" shaped and "L" shaped.

8. The heat dissipating apparatus as described in claim 1, wherein the first and second heat transfer paths in the fins are parallel to each other.

9. The heat dissipating apparatus as described in claim 1, further comprising a heat absorbing plate attached to a bottom surface of the base.

10. A heat dissipating apparatus comprising:
a base configured for absorbing heat from a heat generating component;
a plurality of stacked fins mounted on the base, the fins each comprising a projection member positioned in an air passage formed between two neighboring ones of the fins, the projection member of a first fin connecting with the projection member of a second fin thereby dividing the air passage into a plurality of small air channels; and
at least a heat pipe comprising a heat-absorbing portion thermally contacting with the base, and a heat-dissipating portion contacting with the fins;
wherein the projection members together form a first heat transfer path for transferring the heat from the base to the fins and the at least a heat pipe forms a second heat transfer path for transferring the heat from the base to the fins, the heat generated by the heat generating component being transferred to the fins via the first and second heat transfer paths, thereby increasing the heat dissipating efficiency of the heat dissipating apparatus; and
wherein the fins are stacked together via a plurality of locking members, each of the locking members comprises a finger, the fingers of the first fin engage the main body of the second fin.

11. The heat dissipating apparatus as described in claim 10, wherein the projection member is an air spacing plate extending from a main body of each of the fins, the main body defining a hole neighboring the air spacing plate.

12. The heat dissipating apparatus as described in claim 10, wherein the projection member is a rib extending from one side of the main body.

13. The heat dissipating apparatus as described in claim 10, further comprising a heat absorbing plate attached to a bottom surface of the base and adapted for contacting with a top surface of the heat-generating component.

14. The heat dissipating apparatus as described in claim 13, wherein the heat absorbing plate is made of material having better heat conductivity than the material of the base.

15. The heat dissipating apparatus as described in claim 14, wherein the base is made of aluminum, and the heat absorbing plate is made of copper.

16. The heat dissipating apparatus as described in claim 10, wherein the first and second heat transfer paths in the fins are parallel to each other.

* * * * *